United States Patent
DiCiacce

(10) Patent No.: US 9,744,472 B2
(45) Date of Patent: Aug. 29, 2017

(54) MODULAR ILLUMINATED DECORATIVE ARTICLE

(71) Applicant: Augustine J. DiCiacce, Waverly, NY (US)

(72) Inventor: Augustine J. DiCiacce, Waverly, NY (US)

(*) Notice: Subject to any disclaimer, the term of this patent is extended or adjusted under 35 U.S.C. 154(b) by 0 days.

(21) Appl. No.: 14/953,814

(22) Filed: Nov. 30, 2015

(65) Prior Publication Data

US 2016/0169495 A1 Jun. 16, 2016

Related U.S. Application Data

(60) Provisional application No. 62/090,645, filed on Dec. 11, 2014.

(51) Int. Cl.

| | |
|---|---|
| *F21V 19/00* | (2006.01) |
| *F21V 21/00* | (2006.01) |
| *A63H 33/04* | (2006.01) |
| *B44C 5/00* | (2006.01) |
| *G09F 19/02* | (2006.01) |
| *H05K 1/14* | (2006.01) |

(52) U.S. Cl.
CPC ......... *A63H 33/044* (2013.01); *A63H 33/042* (2013.01); *B44C 5/00* (2013.01); *G09F 19/02* (2013.01); *H05K 1/14* (2013.01); *H05K 2201/047* (2013.01); *H05K 2201/10106* (2013.01); *H05K 2201/10303* (2013.01); *H05K 2201/10424* (2013.01)

(58) Field of Classification Search
CPC ...... A63H 33/044; A63H 33/042; H05K 1/14; H05K 2201/047; H05K 2201/10424; H05K 2201/10303; H05K 2201/10106; G09F 19/02; B44C 5/00
USPC ......................................................... 362/367
See application file for complete search history.

(56) References Cited

U.S. PATENT DOCUMENTS

| | | |
|---|---|---|
| 3,696,548 A | 10/1972 | Teller |
| 4,936,185 A | 6/1990 | Yamaguchi et al. |
| 5,313,729 A | 5/1994 | Sakai et al. |
| 5,577,831 A | 11/1996 | Chang |
| 5,683,172 A | 11/1997 | Huag |
| 6,585,553 B1 | 7/2003 | Fetridge et al. |
| 6,805,605 B2 | 10/2004 | Reining et al. |
| 7,322,873 B2 | 1/2008 | Rosen et al. |
| 7,846,002 B1 | 12/2010 | Mikesell et al. |
| 8,152,544 B1 * | 4/2012 | Hung ............. H01H 13/12 439/188 |
| 8,192,042 B2 | 6/2012 | Tseng |
| 2003/0214259 A9 | 11/2003 | Dowling et al. |

(Continued)

*Primary Examiner* — Donald Raleigh
(74) *Attorney, Agent, or Firm* — Michael J. Nickerson; Basch & Nickerson LLP

(57) ABSTRACT

An illuminated modular decorative article includes a base control panel and a side panel. The base control panel includes a base, a first electrical/mechanical connection interface, and a power source. The side panel includes a base, a second electrical/mechanical connection interface, and illumination sources. The first electrical/mechanical connection interface connects to the second electrical/mechanical connection interface to electrically connect the base control panel to the side panel and to mechanically connect the base control panel substantially orthogonally to the side panel.

20 Claims, 9 Drawing Sheets

(56) References Cited

U.S. PATENT DOCUMENTS

| | | | |
|---|---|---|---|
| 2005/0026509 A1* | 2/2005 | Chang | H01R 13/719 439/676 |
| 2008/0291676 A1* | 11/2008 | Keneman | A63H 33/042 362/249.01 |
| 2015/0029701 A1* | 1/2015 | Weidman | F21L 4/02 362/102 |

* cited by examiner

MODULAR ILLUMINATED DECORATIVE ARTICLE

PRIORITY INFORMATION

This application claims priority, under 35 U.S.C. §119(e), from U.S. Provisional Patent Application, Ser. No. 62/090,645, filed on Dec. 12, 2014. The entire content of U.S. Provisional Patent Application, Ser. No. 62/090,645, filed on Dec. 12, 2014, is hereby incorporated by reference.

BACKGROUND

Throughout the year, various events, some annually, such as Thanksgiving and Christmas, as well as individual festivities, like birthdays, weddings, and graduations, are celebrated, wherein each event may have a unique theme complemented with associated decorative articles to denote the event.

Conventionally, such decorative articles have been limited to use with a specific event.

Moreover, conventionally, the outward appearance of such decorative articles have been static, thereby resulting in substantially the same "look" each time the event is celebrated.

In addition, conventional decorative article the actual shape of the decorative article has been static, again resulting in substantially the same "look" each time the event is celebrated.

It is noted that since conventional decorative articles have been limited to use with a specific event and have a static appearance, multiple event specific decorative articles have been needed to enable the celebrating of multiple events. This need for multiple event specific decorative articles has caused issues with storage and maintenance of the diverse multiple event specific decorative articles.

It is further noted that conventional decorative article have utilized light or light sources as a feature of the decorative function.

Conventionally illuminated decorative articles have utilized incandescent light sources, LED (light emitting diode) light sources, and/or LCD (liquid crystal display) light sources. Each of the light sources present different issues associated with power consumption, power distribution (wiring), placement of the light source(s), controllability of illumination (ON/OFF cycling and dimmable intensity), and/or density of the light sources.

For example, some conventional illuminated decorative articles have utilized LEDS to provide the illuminative feature of the decorative article to reduce power consumption and provide greater freedom of operation with respect to controllability of illumination.

However, the conventional illuminated decorative articles utilizing LEDs as the source for illuminative features have encountered issues with respect to wiring, placement, and density of the LEDs.

Thus, it is desirable to provide a decorative article with a dynamic outward appearance, thereby enabling a potentially different "look" each time the event is celebrated and/or to mitigate the issues with storage and maintenance of the decorative article.

It is also desirable to provide a decorative article with a dynamic shape, thereby enabling a potentially different "look" each time the event is celebrated and/or to mitigate the issues with storage and maintenance of the decorative article.

In addition, it is desirable to provide a decorative article with a dynamic outward appearance and a dynamic shape, thereby enabling a potentially different "look" each time the event is celebrated and/or to mitigate the issues with storage and maintenance of the decorative article.

Moreover, it is desirable to provide a decorative article with a dynamic outward appearance and a dynamic shape which utilizes LED illumination for an illuminative feature, thereby enabling a potentially different "look" each time the event is celebrated, to mitigate the issues with storage and maintenance of the decorative article, to reduce power consumption, and/or provide greater freedom of operation with respect to controllability of illumination.

Furthermore, it is desirable to provide a decorative article with a dynamic outward appearance and a dynamic shape which utilizes LED illumination for an illuminative feature and resolves the issues associated with wiring, placement, and density of the LEDs, thereby enabling a potentially different "look" each time the event is celebrated, to mitigate the issues with storage and maintenance of the decorative article, to reduce power consumption, and/or provide greater freedom of operation with respect to controllability of illumination

BRIEF DESCRIPTION OF THE DRAWINGS

The drawings are only for purposes of illustrating various embodiments and are not to be construed as limiting, wherein.

DETAILED DESCRIPTION

Figure 1:
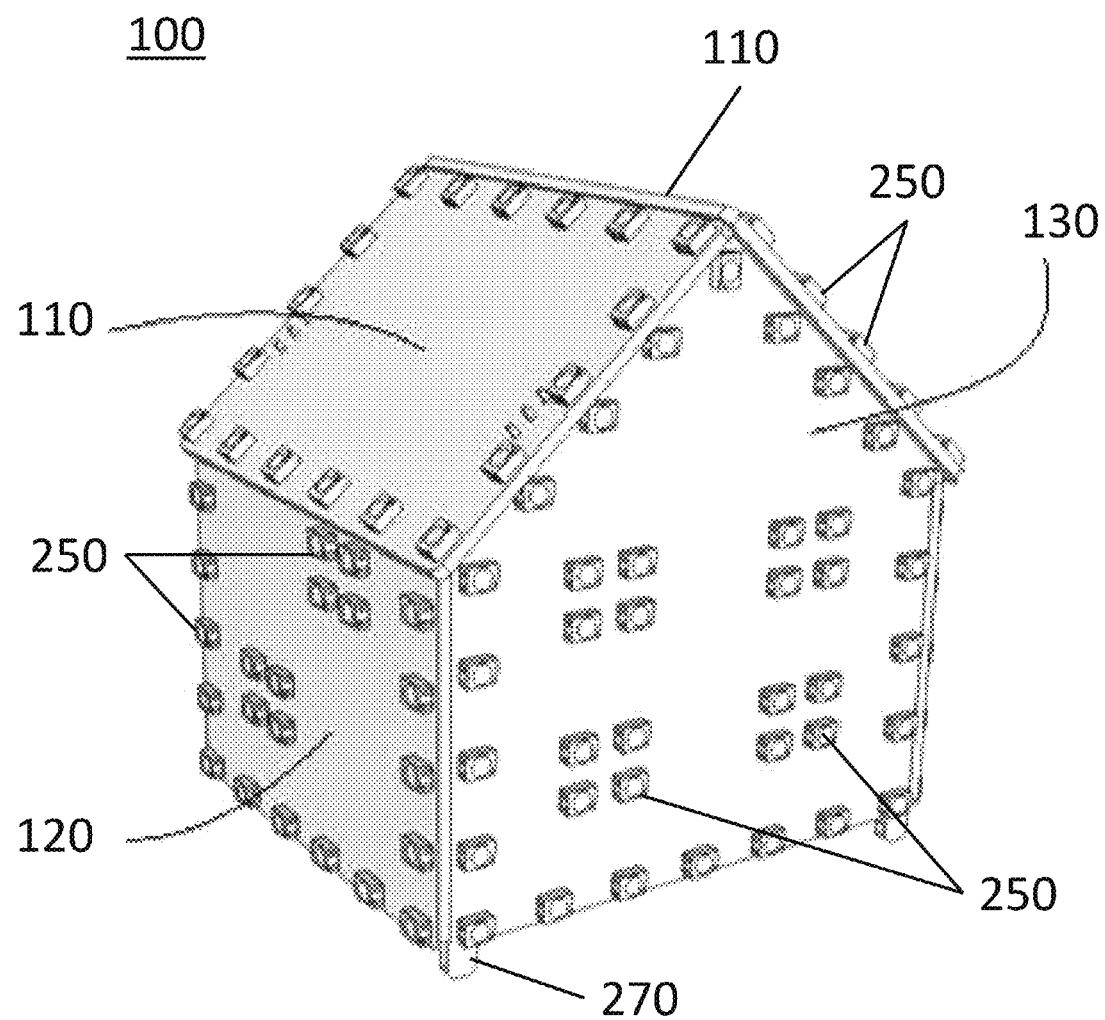
FIG. 1 is an exemplary illustration of an illuminated modular decorative article.

For a general understanding, reference is made to the drawings. In the drawings, like references have been used throughout to designate identical or equivalent elements. It is also noted that the drawings may not have been drawn to scale and that certain regions may have been purposely drawn disproportionately so that the features and concepts could be properly illustrated.

FIG. 1 illustrates an illuminated modular decorative article 100, which resembles a building. As illustrated in FIG. 1, the illuminated modular decorative article 100, which resembles a building, includes roof panels 110 and side panels (120 and 130).

The various panels (110, 120, and 130) may include illumination sources 250. In one embodiment, the illumination sources 250 may be LEDs.

Optionally, the illuminated modular decorative article 100, which resembles a building, may include feet (posts) 270 to raise the illuminated modular decorative article 100, which resembles a building, above the surface, upon which the illuminated modular decorative article 100, which resembles a building, is placed.

It is noted that the panels (110, 120, and 130) may be printed circuit boards.

Figure 2:
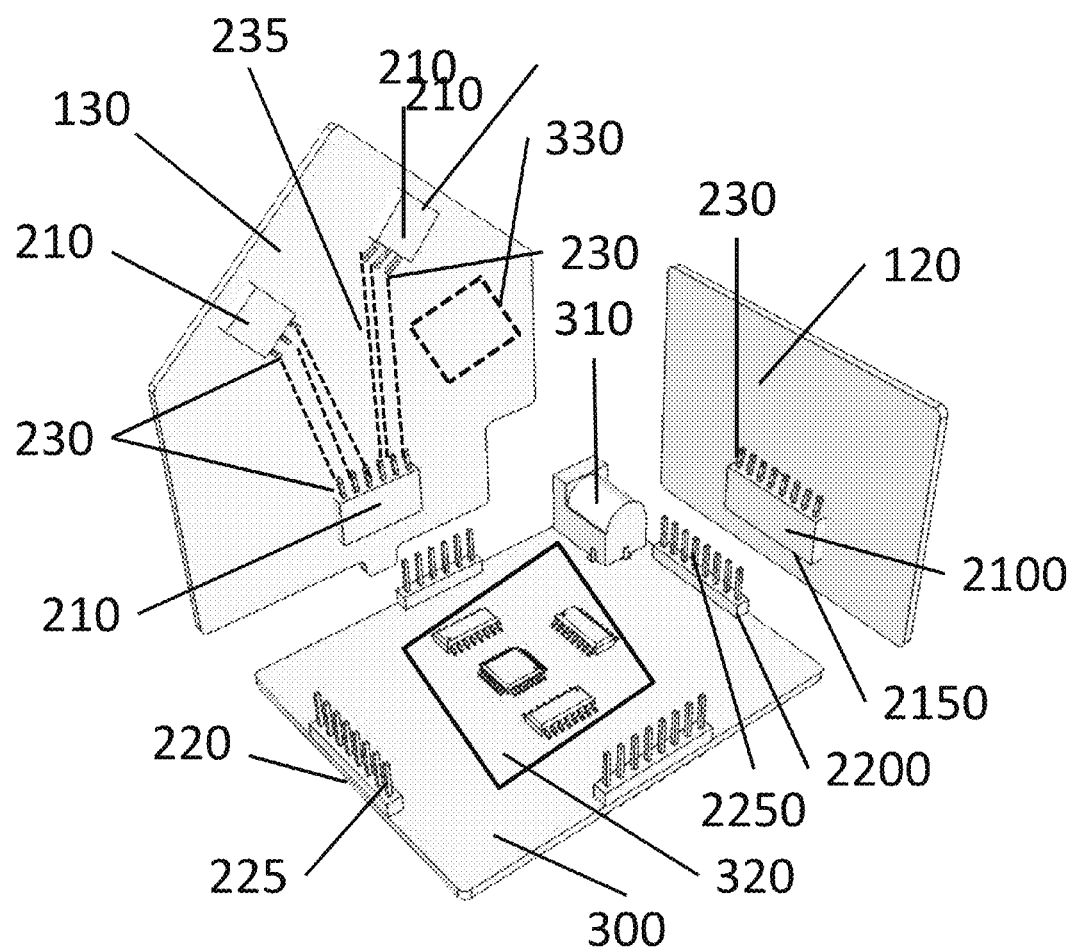
FIG. 2 is an exploded view of part of an illuminated modular decorative article.

FIG. 2 is an exploded view of part of an illuminated modular decorative article. More specifically, FIG. 2 illustrates side panels (120 and 130) and a base control panel 300.

The base control panel 300 includes control circuitry 320, a power source 310, and electrical/mechanical connectors 220. The control circuitry 320 may include a microprocessor, memory, logic circuits, and/or other electronic circuitry.

The power source 310 may be a battery, a rechargeable battery, or a power receptacle for receiving power through a USB-type connection, a power jack, or other low power electrical connection.

The base control panel 300 may be a printed circuit board.

The electrical/mechanical connectors 220 include electrically conducting pins 225 to provide both an electrical connection to another panel as well as a mechanical connection to another panel.

As illustrated in FIG. 2, the electrically conducting pins 225 are substantially orthogonal to the surface of the base control panel 300. It noted that the electrically conducting pins 225 may be located at an outer edge of the base control panel 300, as illustrated in FIG. 2.

The side panels (120 and 130) include electrical/mechanical connectors 210. The electrical/mechanical connectors 210 include electrical receptacles (ports) 215 into which the electrically conducting pins 225 are inserted. The electrical receptacles (ports) 215 provide an electrical connection and a mechanical connection to another panel or an electrical connection and mechanical connection to the base control panel 300.

For example, as illustrated in FIG. 2, the electrically conducting pins 2250 associated with electrical/mechanical connector 2200 of base control panel 300 are inserted into electrical receptacles (ports) 2150 of electrical/mechanical connectors 2100 of side panel 120. By inserting electrically conducting pins 2250 into electrical receptacles (ports) 2150, side panel 120 is electrically and mechanically connected to the base control panel 300.

The electrical receptacles (ports) 215 are substantially parallel to the surface of the side panel on which the electrical receptacles (ports) 215 are located and substantially orthogonal to the surface of the panel having the electrically conducting pins 225. It noted that the electrical receptacles (ports) 215 may be located at an outer edge of the panel, as illustrated in FIG. 2.

It is noted that the electrical receptacles (ports) 215 provide, through electrical conductors 230, an electrical path between the electrically conducting pins 225 of another panel and electrical traces 235 on the side panel on which the electrical receptacles (ports) 215 are located.

Optionally, the electrical receptacles (ports) 215 may provide, through electrical conductors 230, an electrical path between the electrically conducting pins 225 of another panel and control circuitry 330 on the side panel on which the electrical receptacles (ports) 215 are located.

In addition, the electrical receptacles (ports) 215 may provide, through electrical conductors 230, an electrical path between the electrically conducting pins 225 of another panel and the control circuitry 330 and the electrical traces 235 on the side panel on which the electrical receptacles (ports) 215 are located.

As illustrated in FIG. 2, when the electrically conducting pins 225 of the base control panel 300 are inserted into the electrical receptacles (ports) 215, the panels are substantially orthogonal.

Moreover, as illustrated in FIG. 2, the electrical/mechanical connectors 220 and the electrical/mechanical connectors 210 are located on an interior surface of their respective panels.

It is noted that although FIG. 2 illustrates that the base control panel 300 includes electrical/mechanical connectors 220 with electrically conducting pins 225, the base control panel 300 may have included electrical/mechanical connectors 210 with electrical receptacles (ports) 215 and the side panels (120 and 130) may have included electrical/mechanical connectors 220 with pins 225.

It is noted that the panels (300, 120, and 130) may be printed circuit boards.

The control circuitry 320 may provide illumination control for the various illumination sources 250. The control circuitry 320 may control the various illumination sources 250 to illuminate a certain sequence or pattern or may control the various illumination sources 250 to illuminate in synchronization with music.

If the base control panel 300 is equipped with an audio output device, control circuitry 320 may cause the audio output device to generate music or a message.

Figure 3:
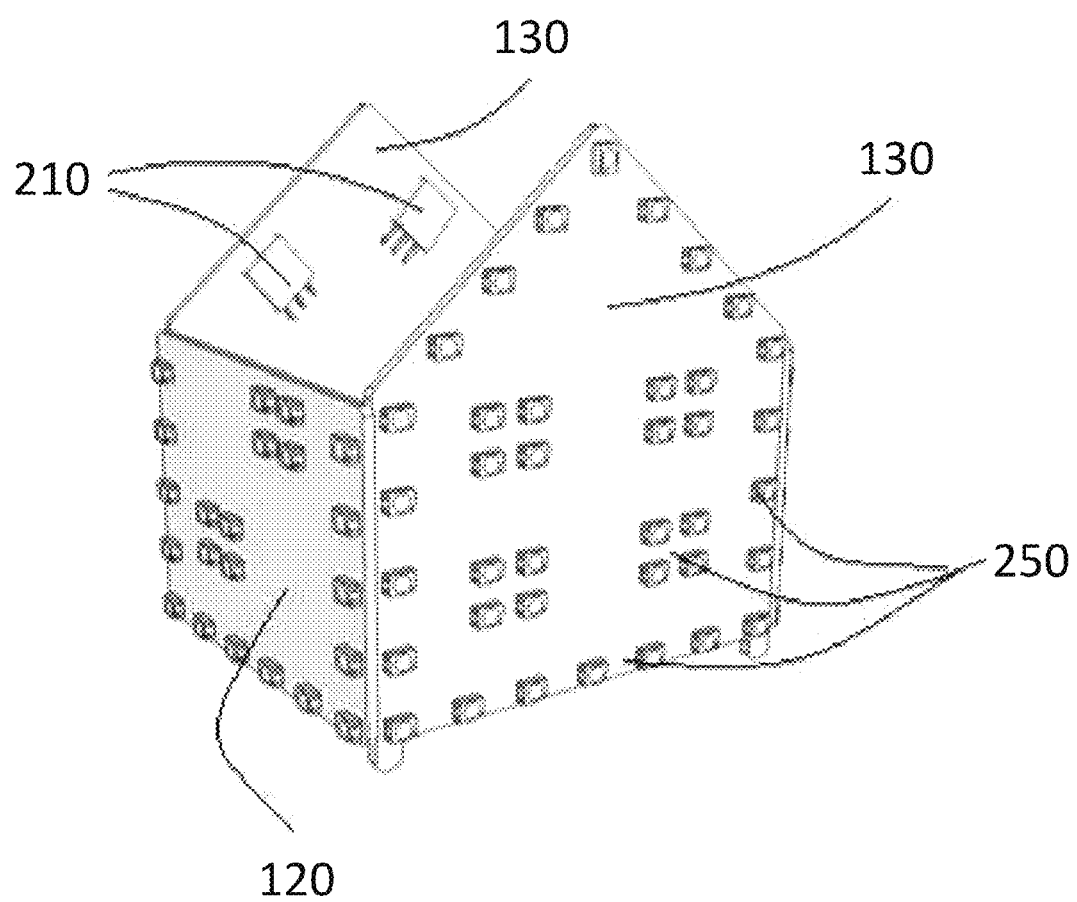
FIG. 3 illustrates a partially constructed illuminated modular decorative article.

FIG. 3 illustrates a partially constructed illuminated modular decorative article. As illustrated in FIG. 3, a side panel 120 is electrically/mechanically connected to a base control panel (not shown), and a side panel 130 is electrically/mechanically connected to a base control panel (not shown).

As a result of the electrical/mechanical connection to the base control panel, the side panel 120 and the side panel 130 are substantially orthogonal to each other and are substantially orthogonal to the base control panel.

It is noted the side panels may also include electrical/mechanical connectors with electrically conducting pins so that side panels can be electrically/mechanically connected to each other, thereby strengthening the rigidity of the illuminated modular decorative article.

Moreover, as illustrated in FIG. 3, illumination sources 250 are located on an exterior surface of their respective panels. It is noted that the electrical/mechanical connectors 210, illustrated in FIG. 3, are located to receive the pins 225 of another panel.

It is noted that the panels (120 and 130) may be printed circuit boards.

Figure 4:
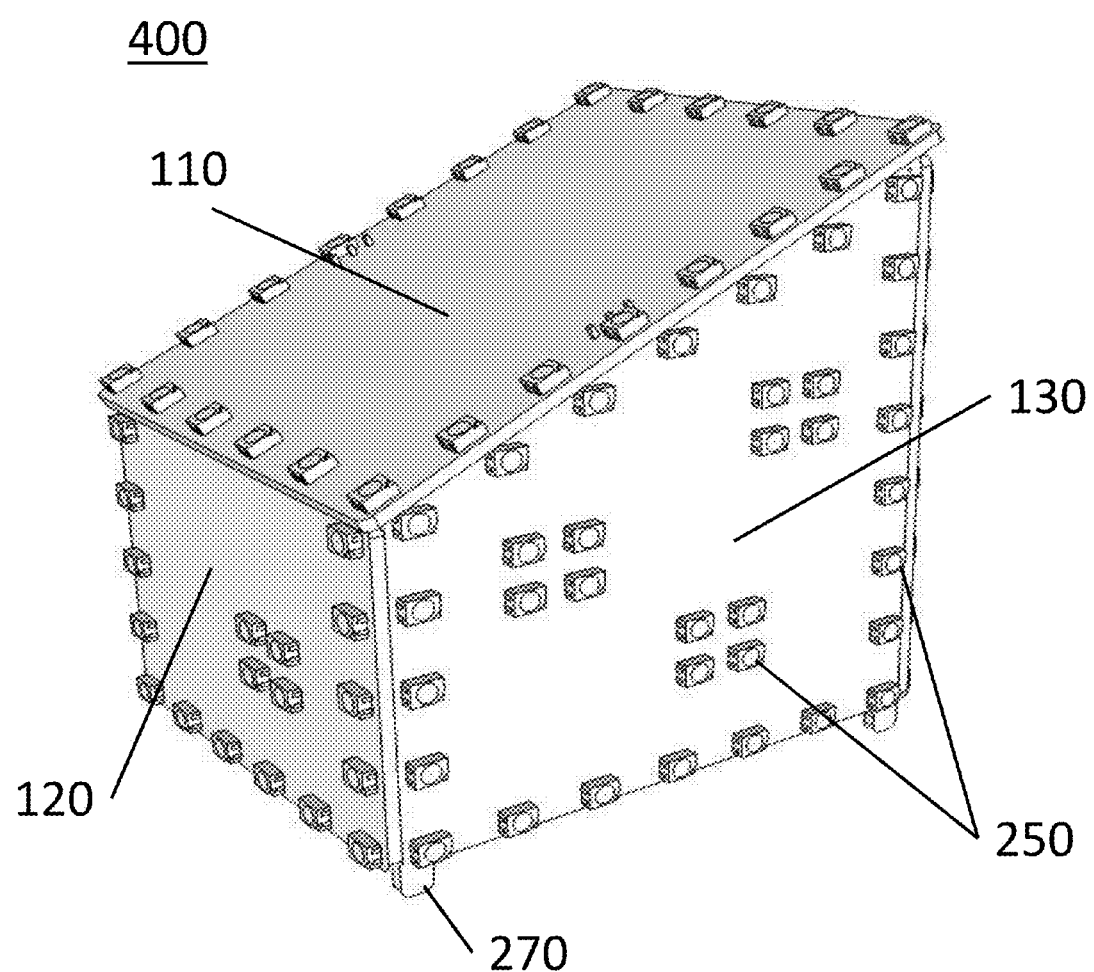
FIG. 4 is another exemplary illustration of an illuminated modular decorative article.

FIG. 4 is another exemplary illustration of an illuminated modular decorative article 400. As illustrated in FIG. 4, the illuminated modular decorative article 400 includes roof panel 110 and side panels (120 and 130).

The various panels (110, 120, and 130) may include illumination sources 250. In one embodiment, the illumination sources 250 may be LEDs.

Optionally, the illuminated modular decorative article 100 may include feet (posts) 270 to raise the illuminated modular decorative article 100 above the surface, upon which the illuminated modular decorative article 100 is placed.

It is noted that the panels (110, 120, and 130) may be printed circuit boards.

Figure 5:
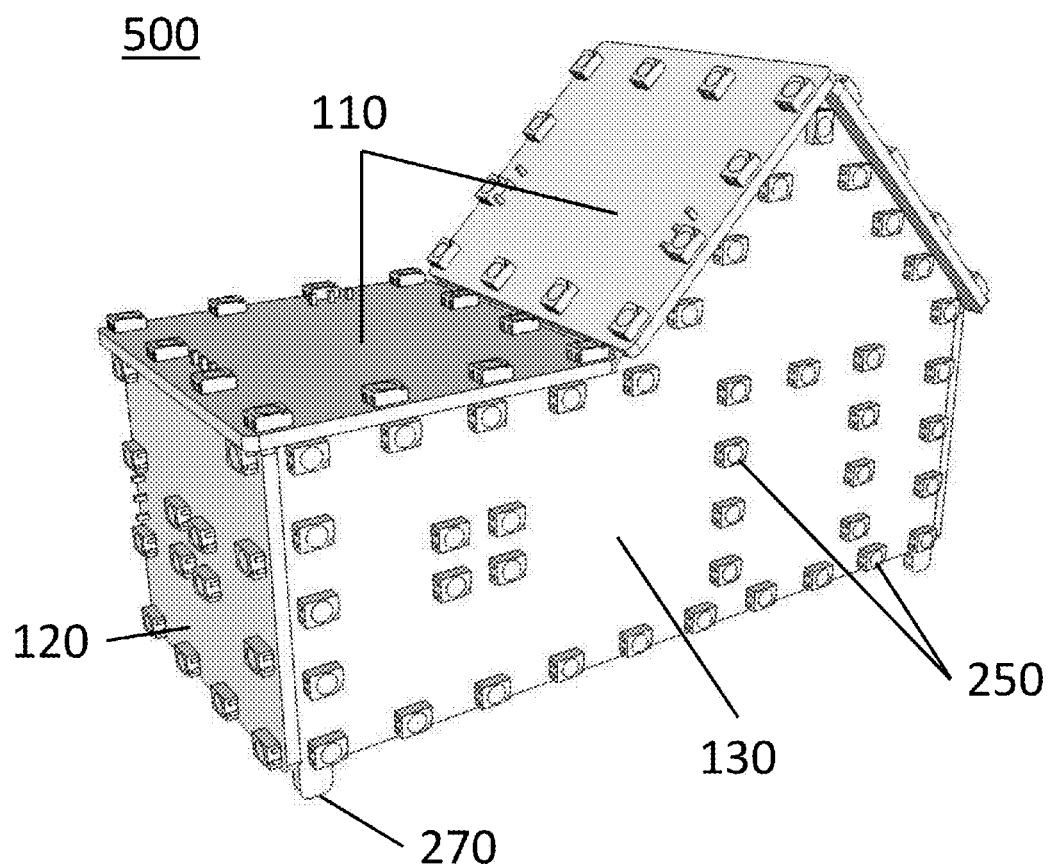
FIG. 5 is another exemplary illustration of an illuminated modular decorative article.

FIG. 5 is another exemplary illustration of an illuminated modular decorative article 500. As illustrated in FIG. 5, the illuminated modular decorative article 500 includes roof panel 110 and side panels (120 and 130).

The various panels (110, 120, and 130) may include illumination sources 250. In one embodiment, the illumination sources 250 may be LEDs.

Optionally, the illuminated modular decorative article 100 may include feet (posts) 270 to raise the illuminated modular decorative article 100 above the surface, upon which the illuminated modular decorative article 100 is placed.

It is noted that the panels (110, 120, and 130) may be printed circuit boards.

Figure 6:
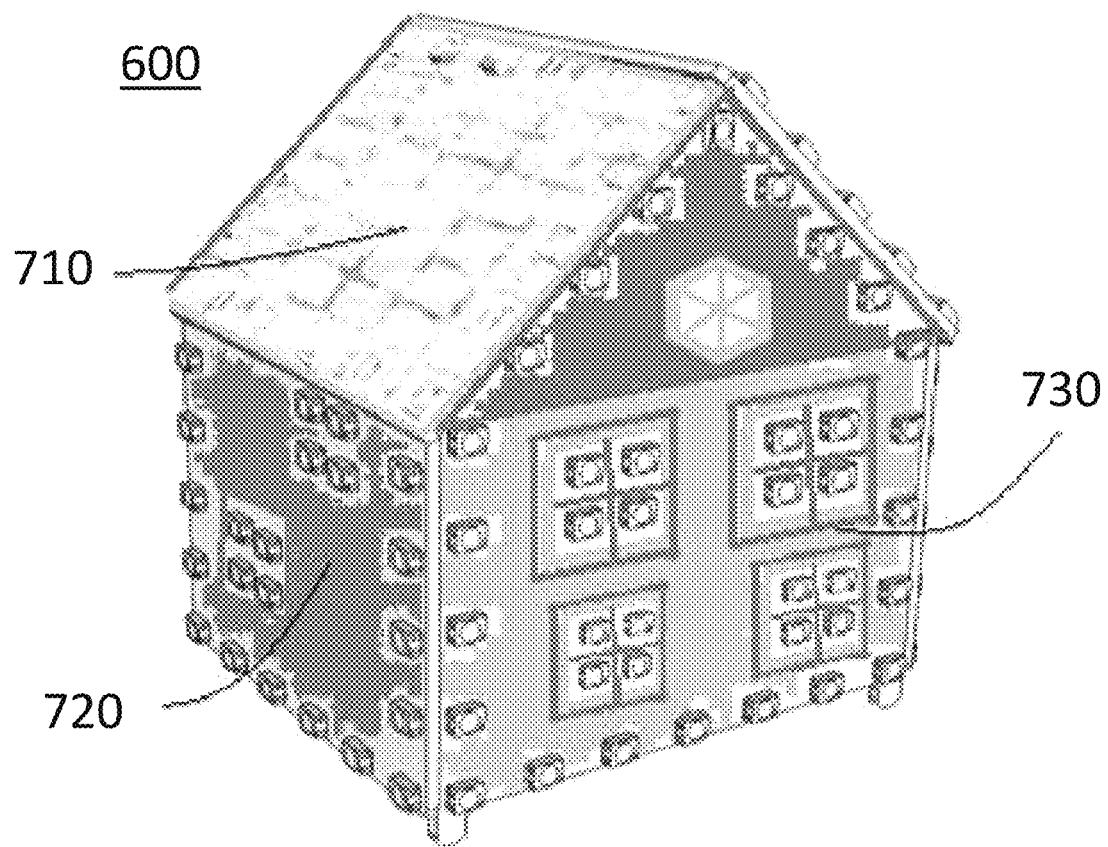
FIG. 6 is an exemplary illustration of an illuminated modular decorative article with an outer surface decorative facade.

FIG. 6 is an exemplary illustration of an illuminated modular decorative article 600 with outer surface decorative facades.

As illustrated in FIG. 6, a façade panel 710 may be attached to the underneath roof panel. The façade panel 710 may be constructed of a plastic and be formed (colored) to resemble a roof, such as a thatched roof or shingled roof. The façade panel 710 may also resemble a snow covered roof or a leaf covered roof.

The façade panel 710 may include holes to allow the illumination sources 250 located on the underneath roof panel to pass therethrough or may include transparent areas associated with the illumination sources 250 located on the underneath roof panel to allow the light from the illumination sources 250 to pass therethrough.

The façade panel 710 may be attached to the underneath roof panel by any conventional attaching mechanism, such as a loop and latch system, a snap, etc.

In addition, as illustrated in FIG. 6, façade panels (720 and 730) may be attached to the underneath side panels. The façade panels (720 and 730) may be constructed of a plastic and be formed (colored) to resemble a side wall of a structure, such as a vinyl siding, brick siding, or a log cabin. The façade panels (720 and 730) may also resemble seasonal aspects.

The façade panels (720 and 730) may include holes to allow the illumination sources 250 located on the underneath side panel to pass therethrough or may include transparent areas associated with the illumination sources 250 located on the underneath side panel to allow the light from the illumination sources 250 to pass therethrough.

The façade panels (720 and 730) may be attached to the underneath side panel by any conventional attaching mechanism, such as a loop and latch system, a snap, etc.

The various façade panels of FIG. 6 allow the exterior of the illuminated modular decorative article to be dynamically changed. The various façade panels of FIG. 6 enable an easy changing of the facade of the illuminated modular decorative article to reflect the event being celebrated or the desired decorative season without requiring separate pre-decorative static structures to reflect the event being celebrated or the desired decorative season.

More specifically, with the use of façade panels, the generic surface texture of the panels can be transformed into stucco, brick, logs, vinyl, stone, shingles, and the like to create a cabin in the woods or a contemporary suburban home.

It is noted that the façade panels (720 and 730) may include illumination sources (not shown) and an electrical/mechanical connector (not shown) for electrically/mechanically connecting the façade panel to the underneath panel.

Figure 7:
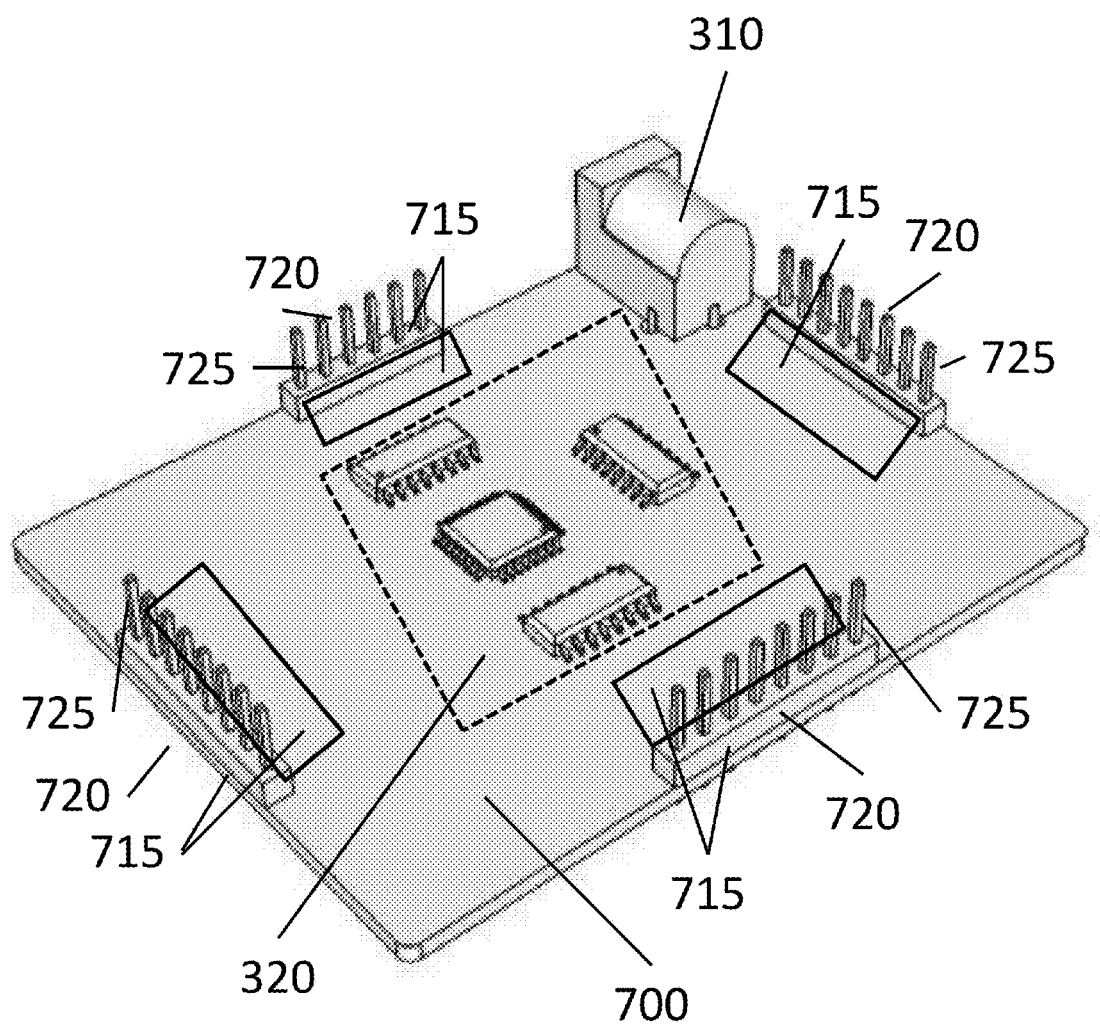
FIG. 7 illustrates a base control panel for an illuminated modular decorative article.

FIG. 7 illustrates a base control panel 700 for an illuminated modular decorative article, which enables exterior expansion of the footprint of the illuminated modular decorative article in a horizontal direction.

More specifically, FIG. 7 illustrate a base control panel 700 with control circuitry 320, a power source 310, and electrical/mechanical connectors 720. The control circuitry 320 may include a microprocessor, memory, logic circuits, and/or other electronic circuitry.

The power source 310 may be a battery, a rechargeable battery, or a power receptacle for receiving power through a USB-type connection, a power jack, or other low power electrical connection.

The base control panel 700 may be a printed circuit board.

The electrical/mechanical connectors 720 include electrically conducting pins 725 to provide an electrical connection to another panel as well as a mechanical connection.

As illustrated, the electrically conducting pins 725 are substantially orthogonal to the surface of the base control panel 700. It noted that the electrically conducting pins 725 may be located at an outer edge of the base control panel 700, as illustrated in FIG. 7.

Figure 8:
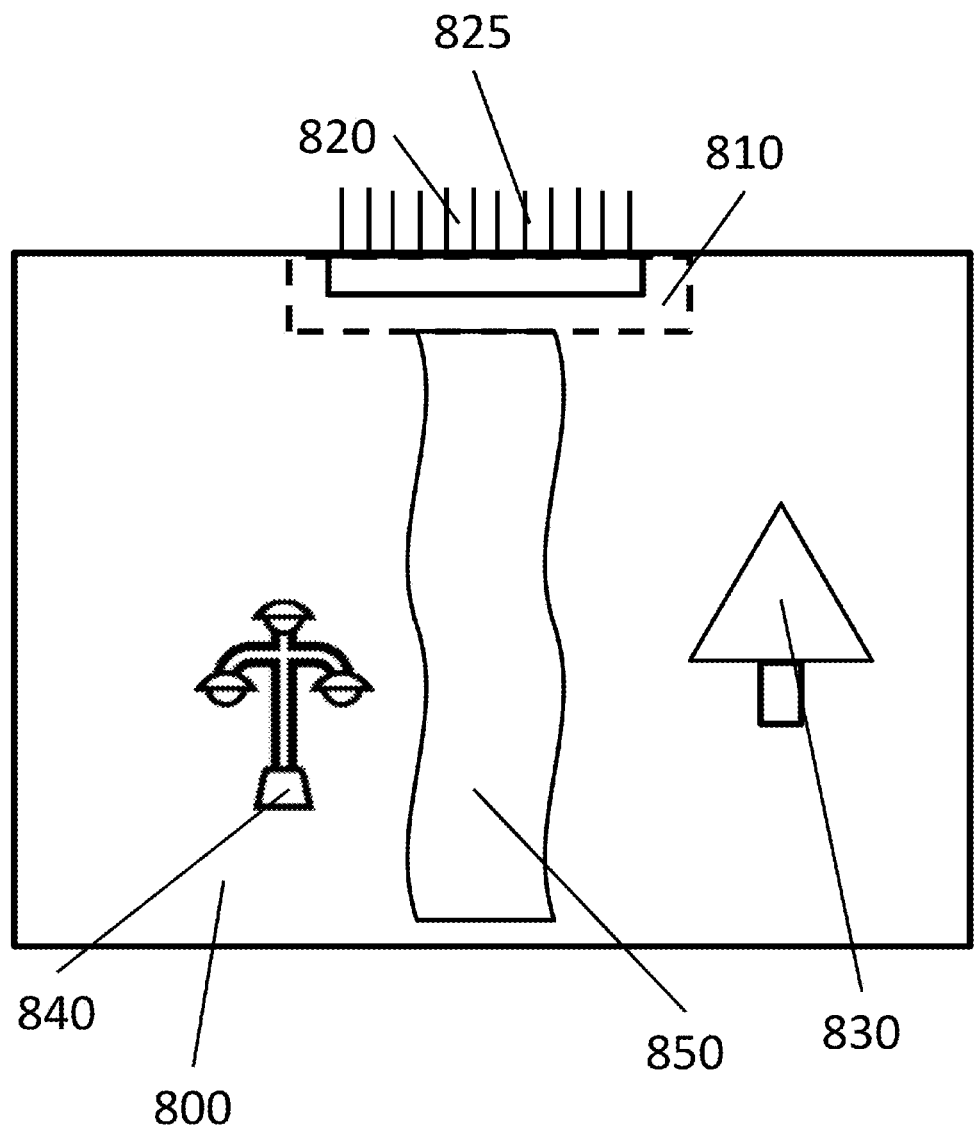
FIG. 8 illustrates an exemplary exterior base panel for an illuminated modular decorative article.

The electrical/mechanical connectors 720 also include electrical receptacles (ports) 715 into which the pins can be inserted. The electrical receptacles (ports) 715 provide an electrical connection and mechanical connection to another panel which would be parallel or co-planar with the base control panel 700. FIG. 8 illustrates an example a co-planar panel.

The electrical receptacles (ports) 715 are substantially parallel to the surface of the base control panel 700 and substantially orthogonal to the electrically conducting pins 725. It noted that the electrical receptacles (ports) 715 and the electrically conducting pins 725 may be electrically tied together or represent independent electrical paths.

It is noted that the electrical receptacles (ports) 715 provide an electrical path between the electrically conducting pins 225 of another panel and the electrical traces on the panel on which the electrically conducting pins 225 are located.

Moreover, as illustrated in FIG. 7, the electrical/mechanical connectors 720 are located on an interior surface of the base control panel 700.

It is noted that although FIG. 7 illustrates that the base control panel 700 includes electrical/mechanical connectors 720 with orthogonal electrically conducting pins 725 and parallel electrical receptacles (ports) 715, the base control panel 700 may have included parallel electrically conducting pins 725 and orthogonal electrical receptacles (ports) 715.

It is noted that the base control panel 700 may be a printed circuit board.

FIG. 8 illustrates an exemplary exterior base panel 800 for an illuminated modular decorative article, which would be co-planar with the base control panel 700.

As illustrated in FIG. 8, the exterior base panel 800 includes an electrical/mechanical connector 820. The electrical/mechanical connector 820 includes electrically conducting pins 825 to provide an electrical connection to a base control panel 700 as well as a mechanical connection. As illustrated, the electrically conducting pins 825 are substantially parallel to the surface of the base control panel 700 and the surface of the exterior base panel 800. It noted that the electrically conducting pins 825 may be located at an outer edge of the exterior base panel 800, as illustrated in FIG. 8.

FIG. 8 also illustrates a façade 810 to cover the electrical/mechanical connector 820. The façade 810 may resemble a front porch, a flower bed, or other scenic item.

It is noted that the exterior base panel 800 may be a printed circuit board.

The exterior base panel 800 may include pre-formed decorative items, such as a tree 830, a lamp post 840, and a walkway 850. The exterior base panel 800 may also include illumination sources (not shown).

It is further noted that the appearance of the exterior base panel 800 may be changed using a façade, as discussed above, with respect to FIG. 6.

Lastly, the exterior base panel 800 may include electrical/mechanical connector sites (not shown) to allow attachment of scenery (landscaping items) to facilitate the reflection of the event being celebrated or the desired decorative season.

Figure 9:
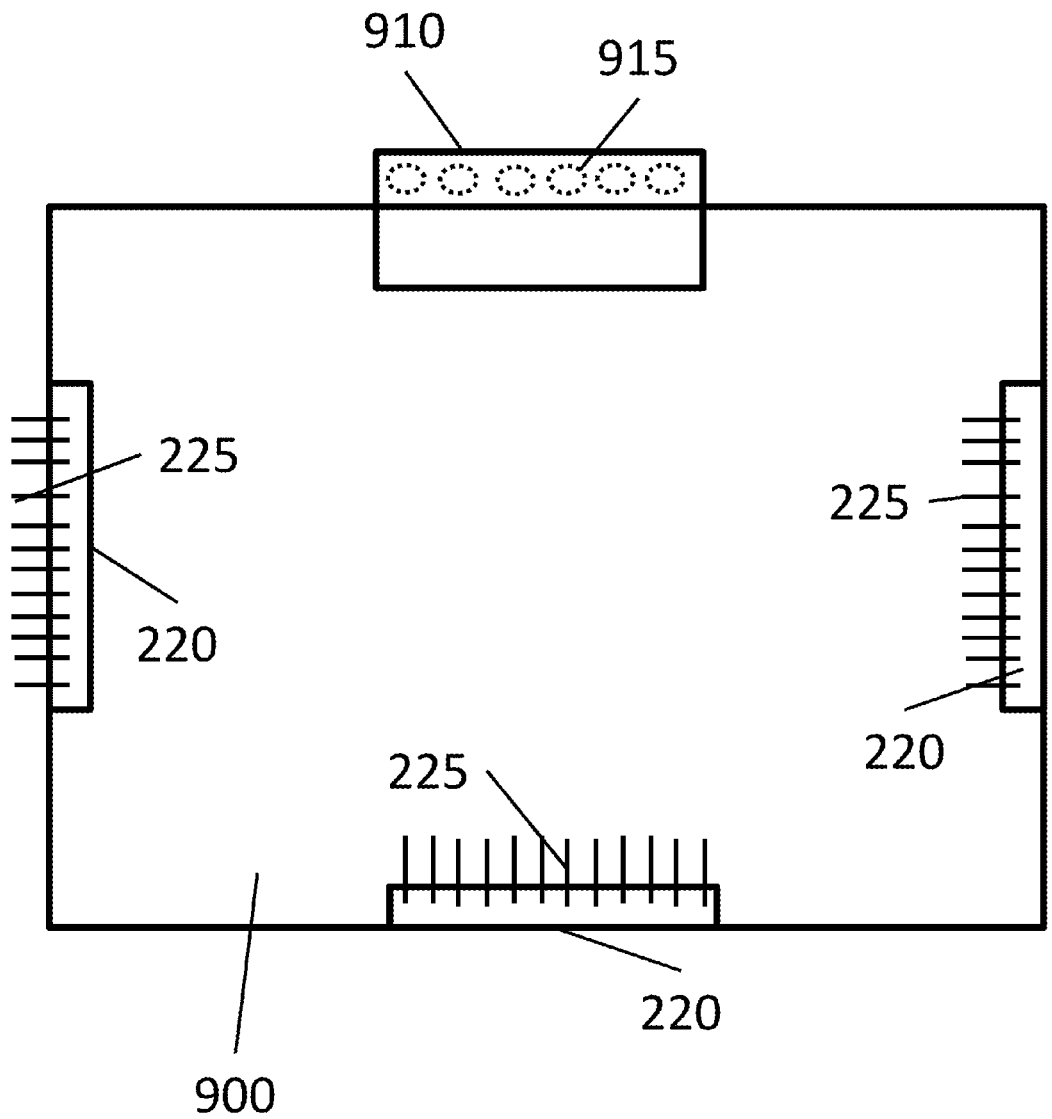
FIG. 9 illustrates an exemplary expansion base panel for an illuminated modular decorative article.

FIG. 9 illustrates an interior base panel 900 for an illuminated modular decorative article, which enables interior expansion of the footprint of the illuminated modular decorative article in a horizontal direction.

As illustrated in FIG. 9, the interior base panel 900 includes an electrical/mechanical connector 910.

The electrical/mechanical connector 910 includes electrical receptacles (ports) 915 to provide an electrical connection to a base control panel 700 as well as a mechanical connection. The electrical/mechanical connector 910 extends beyond the interior base panel 900 such that the electrical receptacles (ports) 915 can electrically and mechanically connect to electrically conducting pins of another base panel, wherein the connected other base panel is co-planar with the interior base panel 900 and the edges associated with the electrical receptacles (ports) 915 of the interior base panel 900 and the electrically conducting pins of the other base panel abut each other.

As illustrated, the electrical receptacles (ports) 915 are substantially orthogonal to the surface of the base control panel 700 and the surface of the interior base panel 900. It noted that the electrical receptacles (ports) 915 may be located at an outer edge of the interior base panel 900, as illustrated in FIG. 9.

The interior base panel 900 also includes electrical/mechanical connectors 220 with electrically conducting pins 225 to provide an electrical connection to another panel as well as a mechanical connection.

As illustrated, the electrically conducting pins 225 are substantially orthogonal to the surface of the interior base panel 900. It noted that the electrically conducting pins 225 may be located at an outer edge of the interior base panel 900, as illustrated in FIG. 9.

It is noted that the control circuitry may control the illumination of the illumination sources such that the illumination sources light up in sequence to music or a predetermined pattern.

It is further noted that each panel may include electronic identification to inform the control circuitry as to the nature of the connected panel, such as the locational arrangement of the illumination sources, whether it is a side panel or roof panel, whether it is an exterior panel or an interior panel, etc.

Moreover, the control circuitry may contain a wireless communication device, such as a Bluetooth™ transmitter/receiver or other wireless transmitter/receiver, to allow communication between illuminated modular decorative articles or between an illuminated modular decorative article and a master controller.

In one arrangement, the disclosed illuminated modular decorative articles may be clustered to depict a Christmas setting, whereby each illuminated modular decorative article is populated with a plurality of illumination sources defining the structural outline of each illuminated modular decorative article as well as structural features, such as windows and doors, and each illuminated modular decorative article would include appropriate facades to further fashion the scene along the theme of a yuletide village, which may or may not be electrified.

The use of strategically positioned illumination sources may provide for a decoration that becomes somewhat dynamic, as well as animated, as the illumination sources are sequenced in a prescribed manner, which may be user selectable.

It is further noted that the illumination sources may provide white illumination or colored illumination, or the illumination sources may provide white illumination and colored filters can be used to facilitate colored illumination.

In summary, an illuminated modular decorative article includes a base control panel and a side panel. The base control panel includes a base, a first electrical/mechanical connection interface, and a power source. The side panel includes a base, a second electrical/mechanical connection interface, and illumination sources. The first electrical/mechanical connection interface connects to the second electrical/mechanical connection interface to electrically connect the base control panel to the side panel and to mechanically connect the base control panel substantially orthogonally to the side panel.

The first electrical/mechanical connection interface may include electrically conducting pins and the second electrical/mechanical connection interface includes electrical receptacles for receiving electrically conducting pins, wherein the first electrical/mechanical connection interface is electrically/mechanically connected to the second electrical/mechanical connection interface when the electrical receptacles of the second electrical/mechanical connection interface receives the electrically conducting pins of the first electrical/mechanical connection interface.

The second electrical/mechanical connection interface may include electrically conducting pins and the first electrical/mechanical connection interface includes electrical receptacles for receiving electrically conducting pins, wherein the second electrical/mechanical connection interface is electrically/mechanically connected to the first electrical/mechanical connection interface when the electrical receptacles of the first electrical/mechanical connection interface receives the electrically conducting pins of the second electrical/mechanical connection interface.

The first electrical/mechanical connection interface may include electrically conducting pins and electrical receptacles for receiving electrically conducting pins associated with another panel; the electrically conducting pins being substantially orthogonal to the electrical receptacles.

The second electrical/mechanical connection interface may include electrically conducting pins and electrical receptacles for receiving electrically conducting pins associated with another panel; the electrically conducting pins being substantially orthogonal to the electrical receptacles.

The base control panel may include control circuitry to control an illumination state of the illumination sources.

The control circuitry may individually control an illumination state of each illumination sources.

The side panel may include electrical traces between the second electrical/mechanical connection interface and the illumination sources.

The illuminated modular decorative article may further include a side facade panel; the side facade panel being attachable to the side panel; the side facade panel including transparent areas associated with locations of the illumination sources on the attached side panel.

The transparent areas may be holes in the side facade panel.

The transparent areas may be areas of transparent material in the side facade panel.

The illuminated modular decorative article may further include a roof panel; the roof panel including a base, a third electrical/mechanical connection interface, and illumination sources; the third electrical/mechanical connection interface connecting to the second electrical/mechanical connection interface to electrically connect the roof panel to the side panel and to mechanically connect the roof panel substantially orthogonally to the side panel.

The illuminated modular decorative article may further included a facade roof panel; the roof facade panel being attachable to the roof panel; the roof facade panel including transparent areas associated with locations of the illumination sources on the attached roof panel.

The base control panel and the side panel may be printed circuit boards.

The base control panel, the side panel, and the roof panel may be printed circuit boards.

The illumination sources may be light emitting diodes.

The base control panel may include multiple electrical/mechanical connection interfaces.

The side panel may include multiple electrical/mechanical connection interfaces.

The illuminated modular decorative article may further include an exterior panel; the exterior panel including a base, a third electrical/mechanical connection interface, and electrical/mechanical connection sites for connecting electrically powered accessory items thereto; the third electrical/mechanical connection interface connecting to the first electrical/mechanical connection interface to electrically connect the base control panel to the exterior panel and to mechanically connect the base control panel substantially co-planar with the exterior panel.

It will be appreciated that various of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art.

What is claimed is:

1. An illuminated modular decorative article, comprising:
    a base control panel; and
    a side panel;
    said base control panel having a first base control panel surface and a second base control panel surface, said first base control panel surface being parallel to said second base control panel surface, said first base control panel surface and said second base control panel surface being on opposite sides of said base control panel;
    said side panel having a first side panel surface and a second side panel surface, said first side panel surface being parallel to said second side panel surface, said first side panel surface and said second side panel surface being on opposite sides of said side panel;
    said first base control panel surface of said base control panel having, mounted thereon, a first electrical/mechanical connection interface and a power source;
    said first side panel surface of said side panel having, mounted thereon, a second electrical/mechanical connection interface;
    said second side panel surface of said side panel having illumination sources located thereon;
    said first electrical/mechanical connection interface connecting to said second electrical/mechanical connection interface to electrically connect said first base control panel surface of said base control panel to said side panel and to mechanically connect said first base control panel surface of said base control panel substantially orthogonally to said first side panel surface of said side panel;
    said first base control panel surface further including, mounted thereon, control circuitry to control an illumination state of said illumination sources, said control circuitry including a microprocessor.

2. The illuminated modular decorative article as claimed in claim 1, wherein said first electrical/mechanical connection interface includes electrically conducting pins and said second electrical/mechanical connection interface includes electrical receptacles for receiving electrically conducting pins;
    said first electrical/mechanical connection interface being electrically/mechanically connected to said second electrical/mechanical connection interface when said electrical receptacles of said second electrical/mechanical connection interface receives said electrically conducting pins of said first electrical/mechanical connection interface.

3. The illuminated modular decorative article as claimed in claim 1, wherein said second electrical/mechanical connection interface includes electrically conducting pins and said first electrical/mechanical connection interface includes electrical receptacles for receiving electrically conducting pins;
    said second electrical/mechanical connection interface being electrically/mechanically connected to said first electrical/mechanical connection interface when said electrical receptacles of said first electrical/mechanical connection interface receives said electrically conducting pins of said second electrical/mechanical connection interface.

4. The illuminated modular decorative article as claimed in claim 1, wherein said first electrical/mechanical connection interface includes electrically conducting pins and electrical receptacles for receiving electrically conducting pins associated with another panel;
    said electrically conducting pins being substantially orthogonal to said electrical receptacles.

5. The illuminated modular decorative article as claimed in claim 1, wherein said second electrical/mechanical connection interface includes electrically conducting pins and electrical receptacles for receiving electrically conducting pins associated with another panel;
    said electrically conducting pins being substantially orthogonal to said electrical receptacles.

6. The illuminated modular decorative article as claimed in claim 1, wherein said control circuitry individually controls an illumination state of each illumination source.

7. The illuminated modular decorative article as claimed in claim 1, wherein said first side panel surface includes electrical traces between said second electrical/mechanical connection interface and said illumination sources.

8. The illuminated modular decorative article as claimed in claim 1, wherein said base control panel and said side panel are printed circuit boards.

9. The illuminated modular decorative article as claimed in claim 1, wherein said illumination sources are light emitting diodes.

10. The illuminated modular decorative article as claimed in claim 1, wherein said first base control panel surface includes multiple electrical/mechanical connection interfaces.

11. The illuminated modular decorative article as claimed in claim 1, wherein said first side panel surface includes multiple electrical/mechanical connection interfaces.

12. The illuminated modular decorative article as claimed in claim 1, further comprising an exterior panel;
said exterior panel including,
a base,
a third electrical/mechanical connection interface, and electrical/mechanical connection sites for connecting electrically powered accessory items thereto;
said third electrical/mechanical connection interface connecting to said first electrical/mechanical connection interface to electrically connect said base control panel to said exterior panel and to mechanically connect said base control panel substantially co-planar with said exterior panel.

13. An illuminated modular decorative article, comprising:
a base control panel;
a side panel; and
a side facade panel;
said base control panel having a first base control panel surface and a second base control panel surface, said first base control panel surface being parallel to said second base control panel surface, said first base control panel surface and said second base control panel surface being on opposite sides of said base control panel;
said side panel having a first side panel surface and a second side panel surface, said first side panel surface being parallel to said second side panel surface, said first side panel surface and said second side panel surface being on opposite sides of said side panel;
said first base control panel surface of said base control panel having, mounted thereon, a first electrical/mechanical connection interface and a power source;
said first side panel surface of said side panel having, mounted thereon, a second electrical/mechanical connection interface;
said second side panel surface of said side panel having illumination sources located thereon;
said first electrical/mechanical connection interface connecting to said second electrical/mechanical connection interface to electrically connect said first base control panel surface of said base control panel to said side panel and to mechanically connect said base control panel substantially orthogonally to said side panel;
said side facade panel being attachable to said second side panel surface;
said side facade panel being detachable from said second side panel surface;
said side facade panel including transparent areas associated with locations of said illumination sources on said second side panel surface of said side panel;
said first base control panel surface further including, mounted thereon, control circuitry to control an illumination state of said illumination sources, said control circuitry including a microprocessor.

14. The illuminated modular decorative article as claimed in claim 13, wherein said transparent areas are holes in said side facade panel.

15. The illuminated modular decorative article as claimed in claim 13, wherein said transparent areas are areas of transparent material in said side facade panel.

16. An illuminated modular decorative article, comprising:
a base control panel;
a side panel; and
a roof panel;
said base control panel having a first base control panel surface and a second base control panel surface, said first base control panel surface being parallel to said second base control panel surface, said first base control panel surface and said second base control panel surface being on opposite sides of said base control panel;
said side panel having a first side panel surface and a second side panel surface, said first side panel surface being parallel to said second side panel surface, said first side panel surface and said second side panel surface being on opposite sides of said side panel;
said first base control panel surface of said base control panel having, mounted thereon, a first electrical/mechanical connection interface and a power source;
said first side panel surface of said side panel having, mounted thereon, a second electrical/mechanical connection interface;
said second side panel surface of said side panel having illumination sources located thereon;
said first electrical/mechanical connection interface connecting to said second electrical/mechanical connection interface to electrically connect said first base control panel surface of said base control panel to said side panel and to mechanically connect said base control panel substantially orthogonally to said side panel;
said first base control panel surface further including, mounted thereon, control circuitry to control an illumination state of said illumination sources, said control circuitry including a microprocessor;
said roof panel having a first roof panel surface and a second roof panel surface, said first roof panel surface being parallel to said second roof panel surface, said first roof panel surface and said second roof panel surface being on opposite sides of said roof panel;
said first roof panel surface including, mounted thereon, a third electrical/mechanical connection interface;
said second roof panel surface including illumination sources located thereon;
said third electrical/mechanical connection interface connecting to said second electrical/mechanical connection interface to electrically connect said roof panel to said side panel and to mechanically connect said roof panel substantially orthogonally to said side panel.

17. The illuminated modular decorative article as claimed in claim 16, further comprising a facade roof panel;
said roof facade panel being attachable to said second roof panel surface;
said roof facade panel being detachable from said second roof panel surface;
said roof facade panel including transparent areas associated with locations of said illumination sources on said roof panel.

18. The illuminated modular decorative article as claimed in claim 16, wherein said base control panel, said side panel, and said roof panel are printed circuit boards.

19. The illuminated modular decorative article as claimed in claim 16, wherein said illumination sources are light emitting diodes.

20. An illuminated modular decorative article, comprising:
a base control panel;
a first side panel; and
a second side panel;

said base control panel having a first base control panel surface and a second base control panel surface, said first base control panel surface being parallel to said second base control panel surface, said first base control panel surface and said second base control panel surface being on opposite sides of said base control panel;

said first side panel having a first side panel surface and a second side panel surface, said first side panel surface being parallel to said second side panel surface, said first side panel surface and said second side panel surface being on opposite sides of said first side panel;

said second side panel having a third side panel surface and a fourth side panel surface, said third side panel surface being parallel to said fourth side panel surface, said third side panel surface and said fourth side panel surface being on opposite sides of said second side panel;

said first base control panel surface of said base control panel including,
 a first electrical/mechanical connection interface, and
 a second electrical/mechanical connection interface;

said first side panel surface of said first side panel including an electrical/mechanical connection interface;

said second side panel surface of said first side panel including illumination sources located thereon;

said third side panel surface of said second side panel including an electrical/mechanical connection interface;

said fourth side panel surface of said second side panel including illumination sources located thereon;

said first electrical/mechanical connection interface connecting to said electrical/mechanical connection interface of said first side panel to provide an electrical connection between said first base control panel surface of said base control panel and said illumination sources of said first side panel;

said second electrical/mechanical connection interface connecting to said electrical/mechanical connection interface of said second side panel to provide an electrical connection between said first base control panel surface of said base control panel and said illumination sources of said second side panel;

said first electrical/mechanical connection interface connecting to said electrical/mechanical connection interface of said first side panel to provide a substantially orthogonal mechanical connection between said base control panel and said first side panel;

said second electrical/mechanical connection interface connecting to said electrical/mechanical connection interface of said second side panel to provide a substantially orthogonal mechanical connection between said base control panel and said second side panel;

said first base control panel surface further including, mounted thereon, control circuitry to control an illumination state of said illumination sources, said control circuitry including a microprocessor.

\* \* \* \* \*